INVENTOR
ERIC WOLFENDALE
BY Fred M. Vogel
AGENT

TRANSISTOR OSCILLATOR CIRCUIT ARRANGEMENT

Filed Dec. 21, 1954 2 Sheets-Sheet 2

INVENTOR
ERIC WOLFENDALE
BY Fred M. Vogel
AGENT 2,820,145

TRANSISTOR OSCILLATOR CIRCUIT ARRANGEMENT

Eric Wolfendale, Horley, England, assignor, by mesne assignments, to North American Philips Company, Inc., New York, N. Y., a corporation of Delaware Application December 21, 1954, Serial No. 476,705

Claims priority, application Great Britain December 23, 1953

6 Claims. (Cl. 250—36)

The invention relates to alternating-current circuit-arrangements of the kind comprising a transistor having an emitter-collector current amplification factor of less than 1 and a reactive impedance included in the circuit between the emitter electrode and the collector electrode. It has for its object to provide circuit-arrangements for producing or amplifying electrical signal oscillations, in which use is made of negative resistance properties of the transistor.

Oscillator arrangements for producing sinusoidal oscillations, for example, are known, in which use is made of a negative resistance characteristic curve of transistors having an emitter-collector current amplification factor of more than 1, for example point-contact transistors. The invention has for its object to provide such an arrangement comprising such a transistor, the current amplification factor of which is less than 1.

The invention has the feature that the transistor is driven at such a high frequency that a phase displacement occurs between the base current and the emitter current, which phase shift in addition to the phase shift produced by the the reactive impedance exceeds 90°, so that the base input impedance of the transistor has a negative resistance component.

In order that the invention may be readily carried into effect, it will now be described with reference to the accompanying drawing, in which.

Figure 1:
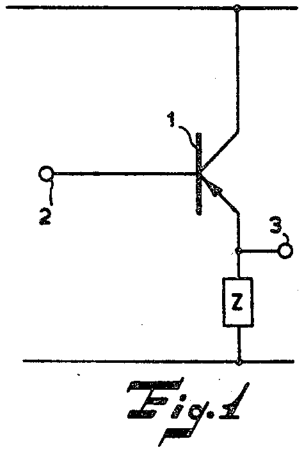
Fig. 1 is a schematic diagram of an embodiment of the circuit arrangement of the present invention.

The circuit arrangement of Fig. 1 comprises a junction transistor 1 in grounded collector connection, i. e. the collector electrode is common to the input circuit and the output circuit of the transistor. The emitter circuit of the transistor includes a load impedance Z and signal oscillations are fed to an input terminal 2, connected to the base electrode, so that amplified oscillations may be obtained from an output terminal 3.

The current amplification factor of such a transistor between its base input and its emitter output is designated by $\alpha'$; its input impedance is then approximately equal to the load impedance Z multiplied by $\alpha'$.

At low frequencies, only a small phase shift occurs between the base current and the emitter current, so that the only phase shift in the arrangement is that produced by the load impedance Z. If, however, the signal frequency increases, the phase shift between the base current and the emitter current increases in a sense such that the input impedance becomes capacitative, i. e. $\alpha'$ may be written in the form $\alpha'=a-jb$ or $|\alpha'|$ exp. $(-j\beta)$. The total phase shift between the input oscillation and the output oscillation then becomes the sum of the phase shift due to the load impedance Z and that of the transistor.

Figure 2:
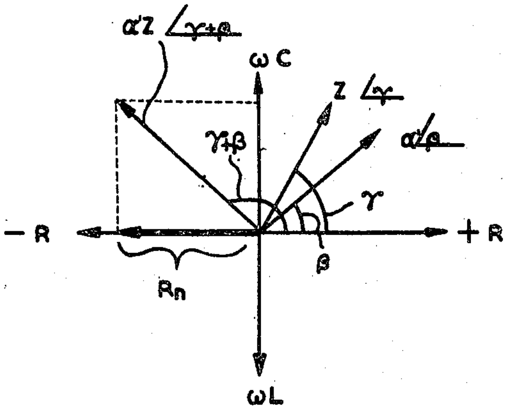
Fig. 2 is a vector diagram illustrating the operation of Fig. 1.

If it is assumed that the load impedance Z produces a phase shift $\gamma$, the total phase shift becomes equal to $\gamma+\beta$ and the input impedance becomes $|\alpha' Z|$ exp. $(\gamma+\beta)$. If the load impedance Z is a capacitative load, the total phase becomes more than 90°, so that the base input impedance of the transistor may be represented by a negative resistor, if necessary in series with the capacity. In the case shown in Fig. 2, this input impedance has a capacitative component $\omega C$ and a negative resistance component $R_n$.

The negative resistance component may be used for producing or amplifying electrical oscillations. If the capacitative component is in resonance with an inductor, the arrangement will oscillate. If a resistor is connected in series with this inductor in a manner such that the total resistance is positive, the arrangement will be suitable for amplifying purposes, as will be explained more fully hereinafter. The impedance Z may be constituted by the parallel combination of a capacitor and a resistor or by a tuned circuit, the tuning frequency of which is so high that the input impedance behaves as a capacitative impedance.

In an oscillator arrangement, a tuned circuit is preferably included in the base circuit of the transistor, the negative resistance component of the base input impedance then producing continuous oscillations in said tuned circuit. Then, in such an arrangement the capacitative component of the base input impedance preferably forms part of the total capacity of the tuned circuit.

Figure 3:
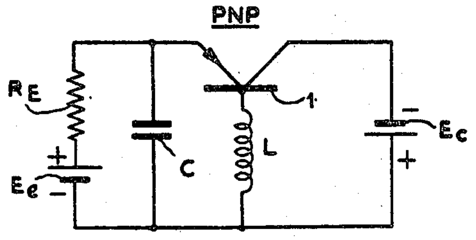
Fig. 3 is a schematic diagram of an embodiment of an oscillator arrangement of the present invention.

Fig. 3 is an oscillator arrangement, in which the transistor 1 is a PNP transistor. The transistor is driven in grounded collector connection and comprises an inductor L in the base circuit and a capacitor C parallel to a resistor $R_E$ in the emitter circuit. The elements C and $R_E$ constitute a capacitative load impedance and the negative resistance thus produced in the base circuit of the transistor 1 produces continuous oscillations across the series resonance circuit constituted by the inductor L in series with the capacitative component of the base input impedance of the transistor.

Figure 4:
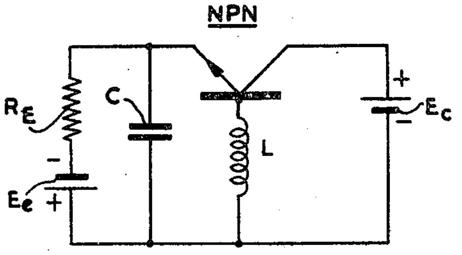
Fig. 4 is a modification of the embodiment of the oscillator arrangement of Fig. 3.

The circuit arrangement of Fig. 3 operates in the same manner if use is made of an NPN transistor, as in Fig. 4, in which the polarity of the supply sources $E_e$ and $E_c$ are reversed.

In the arrangements of Figs. 3 and 4 the oscillator frequency may be varied; for example, by varying the collector voltage $E_C$, without the need for varying the reactances. This may be of importance with frequency modulation arrangements.

The source $E_e$ may, if desired, be interchanged with the resistor $R_E$, or be connected between the junction of the elements $R_E$ and C and the emitter electrode, or between the lower side of the capacitor C and the inductor L.

Figure 5:
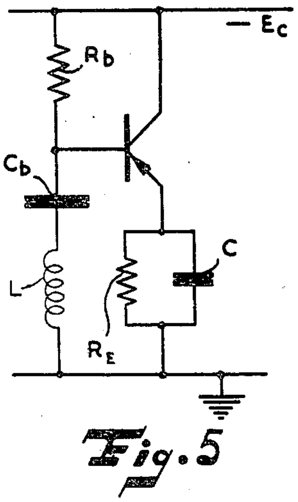
Fig. 5 is a further modification of the embodiment of the oscillator arrangement of Fig. 3.

Fig. 5 is a further modification of the arrangement of Fig. 3, in which the base bias voltage is produced with the aid of a resistor $R_b$. In series with the inductor L is connected a blocking capacitor $C_b$, which has a value such that it substantially does not affect the oscillation frequency of the arrangement.

Figure 6:
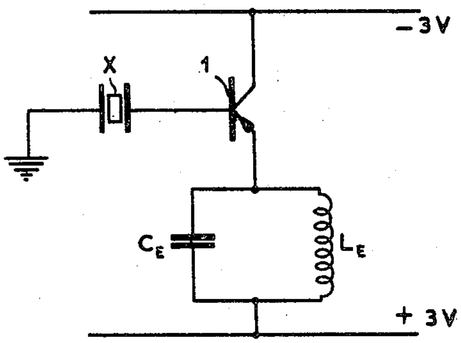
Fig. 6 is a schematic diagram of an embodiment of a crystal oscillator arrangement of the present invention.

Fig. 6 is a crystal oscillator, in which a crystal X is included in the base circuit of the transistor 1 and a parallel resonant circuit $C_E—L_E$ is included in the emitter circuit. The parallel resonant circuit is so proportioned that it constitutes a high capacitative reactance at the crystal resonance frequency. The base bias voltage may, if desired, be produced with the aid of a resistor between the base electrode and the collector electrode. By reversal of the polarity of the supply voltage use may, of course, be made of an NPN transistor instead of the PNP transistor shown. The crystal X may, if desired, be replaced by a series resonant circuit.

Figure 7:
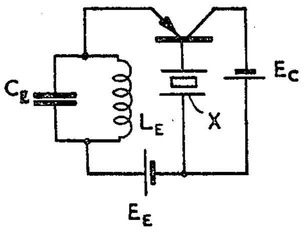
Fig. 7 is a modification of the embodiment of the oscillator arrangement of Fig. 6.

Fig. 7 is a modification of the arrangement of Fig. 6, in which the emitter bias voltage is produced with the aid of a voltage source $E_E$.

Figure 8:
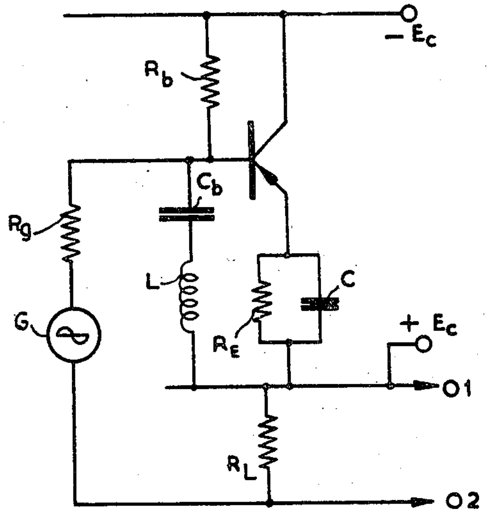
Fig. 8 is a schematic diagram of an embodiment of an amplifying arrangement of the present invention.
Figure 9:
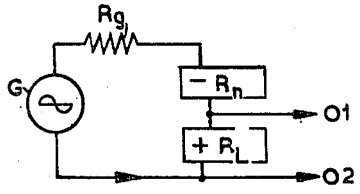
Fig. 9 is an equivalent circuit of the arrangement of Fig. 8.

Fig. 8 is a modification of the arrangement of Fig. 5, serving, however, for the amplification of signal oscillations from a source G. The negative resistance component occurring across the base circuit of the transistor is connected in series with a larger positive load resistor $R_L$, so that self-oscillation of the arrangement is avoided. The oscillations from the generator G having an internal resistor $R_g$, are supplied between these two resistors, i. e. between the base electrode and the lower side of the resistor $R_L$. The output signal is produced across the resistor $R_L$ and may be obtained from output terminals 01 and 02. The amplification is obtained, since, viewed from the generator G, the impedance is equal to the difference between the negative resistance component ($R_n$) and the resistor $R_L$, from which the output signal is obtained. This is evident from the equivalent circuit of Fig. 9. The highest energy amplification is obtained, if $R_g$ is equal to $R_L—R_n$, in which case the amplification is equal to $R_L/R_g$. This amplification is, of course, obtained only with those input frequencies for which the base input impedance has the required negative resistance component.

If desired, the combination $R_E—C$ may be replaced by a parallel resonant circuit with a tuning frequency such that it constitutes a capacitative impedance for the signal frequencies to be amplified.

The negative resistance component of the base input impedance of Fig. 8 may, if desired, be made operative in series with a transmission line, so that an amplification is obtained in both directions of the line.

While the invention has been described by means of specific examples and in specific embodiments, I do not wish to be limited thereto, for obvious modifications will occur to those skilled in the art without departing from the spirit and scope of the invention.

What is claimed is:

1. A circuit arrangement comprising a transistor having an emitter electrode, a collector electrode and a base electrode, said transistor having a characteristic emitter-collector current amplification factor of less than unity, a base input impedance and an emitter circuit coupled to said emitter electrode, means for energizing said electrodes thereby to produce current flow in said electrodes, means for applying an oscillation to said base electrode at a frequency at which a phase shift is produced between the base current and the emitter current and a capacitive impedance is thereby formed between said emitter and base electrodes, and a capacitive impedance connected in the emitter circuit of said transistor for producing a phase shift in the current flowing therethrough, the reactance of said capacitive impedance at said frequency having a value producing a total phase shift greater than ninety electrical degrees in current flowing in the emitter and base paths thereby to impart to said transistor a base input impedance having a negative resistance component.

2. A circuit arrangement comprising a transistor having an emitter electrode, a collector electrode and a base electrode, said transistor having a characteristic emitter-collector current amplification factor of less than unity, a base input impedance having a capacitive component and an emitter circuit coupled to said emitter electrode, means for energizing said electrodes thereby to produce current in said electrodes, means for applying an oscillation to said base electrode at a frequency at which a phase shift is produced between the base current and the emitter current and a capacitive impedance is thereby formed between said emitter and base electrodes, said last-mentioned means comprising a resonant circuit comprising an inductor connected to said base electrode and a capacity comprising said capacitive component of said base input impedance, and a capacitive impedance connected in the emitter circuit of said transistor for producing a phase shift in current flowing therethrough, the reactance of said capacitive impedance at said frequency having a value producing a total phase shift greater than ninety electrical degrees in current flowing in the emitter and base paths thereby to impart to said transistor a base input impedance having a negative resistance component.

3. A circuit arrangement comprising a transistor having an emitter electrode, a collector electrode and a base electrode, said transistor having a characteristic emitter-collector current amplification factor of less than unity, a base input impedance and an emitter circuit coupled to said emitter electrode, means for energizing said electrodes thereby to produce current in said electrodes, means for applying an oscillation to said base electrode at a frequency at which a phase shift is produced between the base current and the emitter current and a capacitive impedance is thereby formed between said emitter and base electrodes, said last-mentioned means comprising a resonant circuit comprising an inductor coupled to said base electrode, a blocking capacitor interposed between said inductor and said base electrode, and a capacitive impedance connected in the emitter circuit of said transistor for producing a phase shift in current flowing therethrough, the reactance of said capacitive impedance at said frequency having a value producing a total phase shift greater than ninety electrical degrees in current flowing in the emitter and base paths thereby to impart to said transistor a base input impedance having a negative resistance component.

4. A circuit arrangement comprising a transistor having an emitter electrode, a collector electrode and a base electrode, said transistor having a characteristic emitter-collector current amplification factor of less than unity, a base input impedance and an emitter circuit coupled to said emitter electrode, means for energizing said electrodes thereby to produce current in said electrodes, means for applying an oscillation to said base electrode at a frequency at which a phase shift is produced between the base current and the emitter current and a capacitive impedance is thereby formed between said emitter and base electrodes, said last-mentioned means comprising a piezoelectric crystal connected to said base electrode, said piezoelectric crystal having a resonant frequency, and a capactive impedance connected in the emitter circuit of said transistor for producing a phase shift in current flowing therethrough, said capacitive impedance comprising a parallel resonant circuit having a high capacitive reactance at the resonant frequency of said crystal, the reactance of said capacitive impedance at said frequency having a value producing a total phase shift greater than ninety electrical degrees in current flowing in the emitter and base paths thereby to impart to said transistor a base input impedance having a negative resistance component.

5. A circuit arrangement comprising a transistor having an emitter electrode, a collector electrode and a base electrode, said transistor having a characteristic emitter-collector current amplification factor of less than unity, a base input impedance and an emitter circuit coupled to said emitter electrode, means for energizing said electrodes thereby to produce current in said electrodes, means for applying an oscillation to said base electrode at a frequency at which a phase shift is produced between the base current and the emitter current and a capacitive impedance is thereby formed between said emitter and base electrodes, said last-mentioned means comprising a resonant circuit comprising an inductor coupled to said base electrode, a blocking capacitor interposed between said inductor and said base electrode, a capacitive impedance connected in the emitter circuit of said transistor for producing a phase shift in current flowing therethrough, the reactance of said capacitive impedance at said frequency having a value producing a total phase shift greater than ninety electrical degrees in current flowing in the emitter and base paths thereby to impart to said transistor a base input impedance having a negative resistance component, means for avoiding oscillations comprising a load resistor connected at one end to a common point between said resonant circuit and said capacitive impedance, means for applying an input signal between the other end of said load resistor and a common point between said resonant circuit and said base electrode, and means for deriving from said load resistor an output signal having a magnitude relatively greater than that of said input signal.

6. A circuit arrangement comprising a transistor having an emitter electrode, a collector electrode and a base electrode, said transistor having a characteristic emitter-collector current amplification factor of less than unity, a base input impedance having a capacitive component and an emitter circuit coupled to said emitter electrode, means for energizing said electrodes thereby to produce current in said electrodes, means for applying an oscillation to said base electrode at a frequency at which a phase shift is produced between the base current and the emitter current and a capacitive impedance is thereby formed between said emitter and base electrodes, said last-mentioned means comprising a resonant circuit comprising an inductor coupled to said base electrode and a capacity comprising said capacitive component of said base input impedance, a blocking capacitor interposed between said inductor and said base electrode, a capacitive impedance connected in the emitter circuit of said transistor for producing a phase shift in current therethrough, the reactance of said capacitive impedance at said frequency having a value producing a total phase shift greater than ninety electrical degrees in current flowing in the emitter and base paths thereby to impart to said transistor a base input impedance having a negative resistance component, means for avoiding oscillations comprising a load resistor connected at one end to a common point between said resonant circuit and said capacitive impedance, said load resistor having a resistance value relatively larger than that of said negative resistance component of said base input impedance, means for applying an input signal between the other end of said load resistor and a common point between said resonant circuit and said base electrode, and means for deriving from said load resistor an output signal having a magnitude relatively greater than that of said input signal.

References Cited in the file of this patent

UNITED STATES PATENTS

| | | |
|---|---|---|
| 2,415,049 | Snyder | Jan. 28, 1947 |
| 2,570,436 | Eberhard et al. | Oct. 9, 1951 |
| 2,692,337 | Hanson | Oct. 19, 1954 |

OTHER REFERENCES

Article: "Junction Transistor Equivalent Circuits and Vacuum-Tube Analogy," by Giacolletto, pages 1490–93 of P. I. R. E. for November 1952.